(12) United States Patent
Zimmerman

(10) Patent No.: US 7,519,891 B2
(45) Date of Patent: Apr. 14, 2009

(54) IO SELF TEST METHOD AND APPARATUS FOR MEMORY

(75) Inventor: David J. Zimmerman, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 334 days.

(21) Appl. No.: 11/238,897

(22) Filed: Sep. 28, 2005

(65) Prior Publication Data

US 2007/0089006 A1 Apr. 19, 2007

(51) Int. Cl.
*G01R 31/28* (2006.01)
(52) U.S. Cl. .................................... 714/738
(58) Field of Classification Search .................... 714/738
See application file for complete search history.

(56) References Cited

U.S. PATENT DOCUMENTS 6,871,311 B2 * 3/2005 Watanabe et al. ........... 714/738
2003/0177423 A1 * 9/2003 Komatsu et al. ............ 714/700
2005/0080581 A1 4/2005 Zimmerman et al. ........ 702/117
2006/0015787 A1 * 1/2006 Wang et al. ................. 714/726

* cited by examiner

*Primary Examiner*—James C Kerveros
(74) *Attorney, Agent, or Firm*—Alan K. Aldous

(57) ABSTRACT

A memory includes a data generator to generate a data pattern, a transmitter in communication with the data generator, the transmitter to transmit the data pattern as a test data pattern, receiver to receive the test data pattern from the transmitter, and a comparator coupled with the receiver, the comparator to compare the data pattern with the test data pattern from the receiver and to verify proper operation of a memory channel. A method includes providing a seed value to a transmit and a receive pattern generator in a memory, generating data at the transmit pattern generator from the seed value and transmitting the data from the memory, looping the data to a receiver on the memory, using the seed value to generate data with the receive pattern generator, and comparing the data from the receive pattern generator and the transmit pattern generator to determine if any errors occurred.

6 Claims, 6 Drawing Sheets

IO SELF TEST METHOD AND APPARATUS FOR MEMORY

BACKGROUND OF THE INVENTION

Semiconductor technologies continue to evolve. Computing and communications designs are incorporating more functionality, higher processing and transmission speeds, smaller sizes, more memory, etc., into smaller and more robust architectures. These trends have placed particular demands on interconnect architectures.

Semiconductor memories are advancing in many ways. Memory devices have increased capacities, increased operating frequencies, reduced latencies, etc., all while ramping with the exponential density increases according to Moore's Law.

To improve memory IO capability, high-speed serial links can be used to couple memories with memory controllers. Unfortunately, these links operate at speeds that are not testable in a cost effective manner on conventional equipment such as automatic test equipment (ATE), burn in ovens or other test hardware.

Conventional DRAMs have single ended interfaces that are tested at speed on automatic test equipment (ATE). As DRAM speeds increase this test method becomes increasingly difficult and costly. This equipment is currently capable of testing memory up to 1067 MHz. Future DRAM interfaces are expected to operate at 3.2 GHz and above, which may require testers that are considerably faster and more costly.

One way to address this problem is to incorporate on-die circuitry for IO self-test. On-die pattern generator and checker circuits have been proposed in the past for testing of high-speed logic chips. One example of this is an interconnect built in self test (IBIST), which is an emerging standard for testing of high-speed connections for logic chips. Unlike logic chips, memory chips have limitations on the number of gates that can be cost-effectively integrated on a die.

BRIEF DESCRIPTION OF THE DRAWINGS

Embodiments of the invention may be best understood by reading the disclosure with reference to the drawings, wherein.

DETAILED DESCRIPTION

In the following description, numerous specific details are set forth. However, it is understood that embodiments of the inventions may be practiced without these specific details. In other instances, well-known circuits, structures, and techniques have not been shown in detail in order to not obscure the understanding of this description.

Reference in the specification to "one embodiment" or "an embodiment", etc., means that a particular feature, structure, or characteristic described in connection with the embodiment is included in at least one aspect of the invention. The appearances of the phrase "in one embodiment" in various places in the specification do not necessarily all refer to the same embodiment.

Embodiments may use a simple data generator and checker to create data patterns at the normal operating speed of the link. In these embodiments, the data patterns can be checked with complimentary data checker logic. This allows a memory test method that is not dependent on ATE. Additionally, the method can be applied with external connections, allowing the connections to be tested along with a memory IO. An embodiment may use a random data generator, as opposed to an algorithmic data generator, for example, an embodiment may use a linear feedback shift register (LFSR) for data generation.

Some embodiments may generate and check data to verify proper operation of a memory channel. For example, embodiments may be included in a DRAM and used to generate and check data to verify proper operation of a high-speed serial differential link. In general, embodiments may provide a method or apparatus to test memory IO at speed by using a built-in data generator and checker. Additionally, a built-in test data generator may provide for detection of defects in IO cells or in associated connections.

Figure 1:
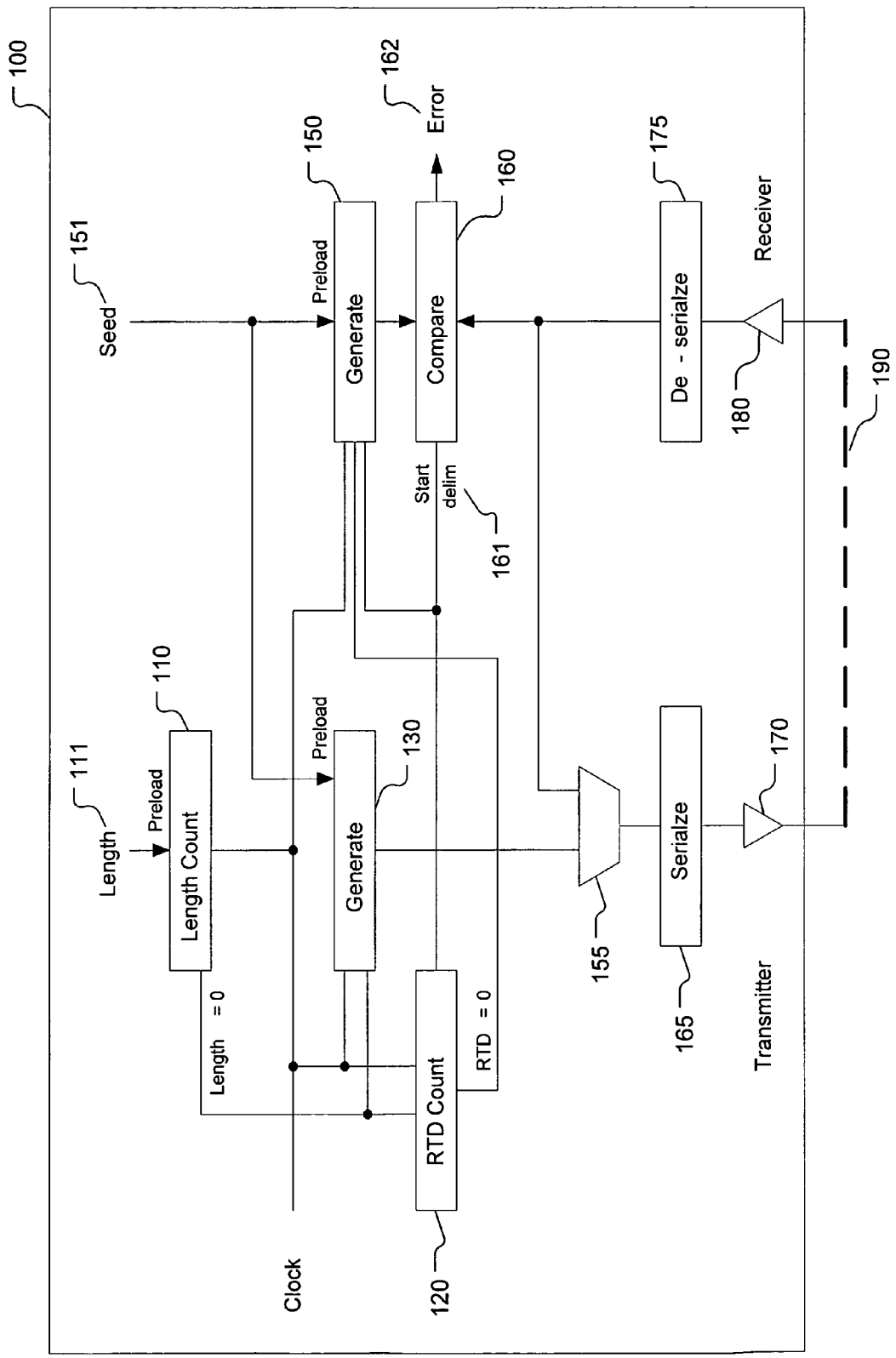
FIG. 1 illustrates an embodiment comprising a data generator and checker to provide a self test method and apparatus for memory.

FIG. 1 illustrates a data generator and checker embodiment 100 to self test a memory. The embodiment 100 may use a data generator 130 to generate a data pattern to be transmitted through memory outputs. In some embodiments the data pattern may be a pseudo-random data pattern, for example a pseudo-random data pattern generated by an LFSR. The data pattern can then be routed to memory inputs and data generator 150 may generate a data pattern that can be compared to the input data. If the input data does not match the expected pattern, a failure may be indicated. Some embodiments may use an LFSR as a data generator. Embodiments may also use a single data generator to compare an incoming data pattern to an expected data pattern.

Referring to FIG. 1, embodiment 100 has data generators 130 and 150 that may receive a seed 151 and generate a data pattern. The data pattern may be sent from data generator 130 out a transmitter 170 and through a memory output. In the present embodiment 100, data generator 130 sends the data pattern through multiplexer 155 and then serializes the data pattern at serializer 165 to be sent through a memory output with transmitter 170.

After the data pattern is transmitted from a memory output, it can be communicated to an input of the memory to be used as a test data pattern to test the IO of the memory. For example, data generator 150 may generate the same pattern as generator 130, and the test data pattern that was transmitted off the memory may be received at receiver 180 and compared in a comparator 160 to the pattern from data generator 150 to verify proper operation of a memory channel. If the comparator 160 finds a difference, an error 162 is signaled.

Referring to FIG. 1, embodiment 100 may further include a length counter 110 to count the length of the data pattern to be transmitted and a round trip delay (RTD) counter 120 to time the delay between transmitting the data pattern off chip and receiving the data pattern back on chip.

Embodiments may use data patterns of any length or complexity to test memory IO. For example, an embodiment may use an LFSR employing a 32-bit polynomial according to the IEEE 802.3 (Ethernet) standard as a data pattern to test memory IO such as:

$$P(x)=x^{32}+x^{26}+x^{23}+x^{22}+x^{16}+x^{12}+x^{11}+x^{10}+x^8+x^7+x^5+x^4+x^2+x+1$$

Referring to FIG. 1, a seed value 151 may be stored in the pattern generator 130 and pattern generator 150. At a certain time the pattern generator 130 may be enabled. For example, the pattern generator 130 may be enabled during link initialization. According to this embodiment, a data pattern can then be serialized at serializer 165 and sent off chip through transmitter 170. The data pattern may then be sent to the receiver 180. In some embodiments the data can be looped back from transmitter 170 to receiver 180 with external wiring or through a host controller or other memory chip. The incoming data is then de-serialized at deserializer 175 and sent to the comparator 160.

In some embodiments, since the time from transmit to receive is not known, the compare unit and pattern generator 150 may have to wait some number of cycles before generating the data pattern. In an embodiment this delay may be accomplished by using a start delimiter in the data. When the start delimiter is received and recognized the comparator 160 may enable pattern generator 150. In an embodiment, the start delimiter may be the first value from the pattern generator.

In an embodiment, each subsequent clock of a data generator will generate the next code in the sequence. The number of clocks between the transmission and receipt of the start delimiter may be counted by RTD counter 120. The comparator 160 can continue to compare codes with incoming data and if the data is not the same an error flag is raised.

The length counter 110 may start when the pattern generator 130 starts generating a test pattern, and upon expiration of the length counter 110 the transmit pattern is complete. The receive pattern will continue until the last sequence is received and compared in comparator 160. An embodiment may determine the end of the test pattern by running the RTD counter 120 upon expiration of the length counter 110 and when the RTD counter 120 expires, the test is complete.

Embodiments may use an end delimiter instead of a start delimiter and counters. An end delimiter can be generated at the end of a transmitted data pattern and used to designate the end of a testing pattern on a receiving memory, but a limitation with an end delimiter approach is that a code used as an end delimiter must not occur elsewhere in the data pattern otherwise the test would be prematurely ended.

An embodiment may comprise a memory 100 that includes a data generator 130 to generate a data pattern, a transmitter 170 in communication with the data generator, the transmitter 170 to transmit the data pattern as a test data pattern, a receiver 180 to receive the test data pattern from the transmitter, and a comparator 160 coupled with the receiver 180, the comparator 160 to compare the data pattern with the test data pattern from the receiver 180 and to verify proper operation of a memory channel.

Some embodiments may further comprise a start delimiter to delay comparing the data patterns to allow for delay in transmitting and receiving the data pattern. In some embodiments, the data generator 130 includes an LFSR to generate the data pattern from a seed value. Embodiments might further comprise a second data generator 150 to generate the data pattern from the seed value and provide it to the comparator 160 to compare with the test data pattern. Yet another embodiment may comprise a length counter 110 to determine the end of the comparison between the data pattern and the test data pattern.

Figure 2:
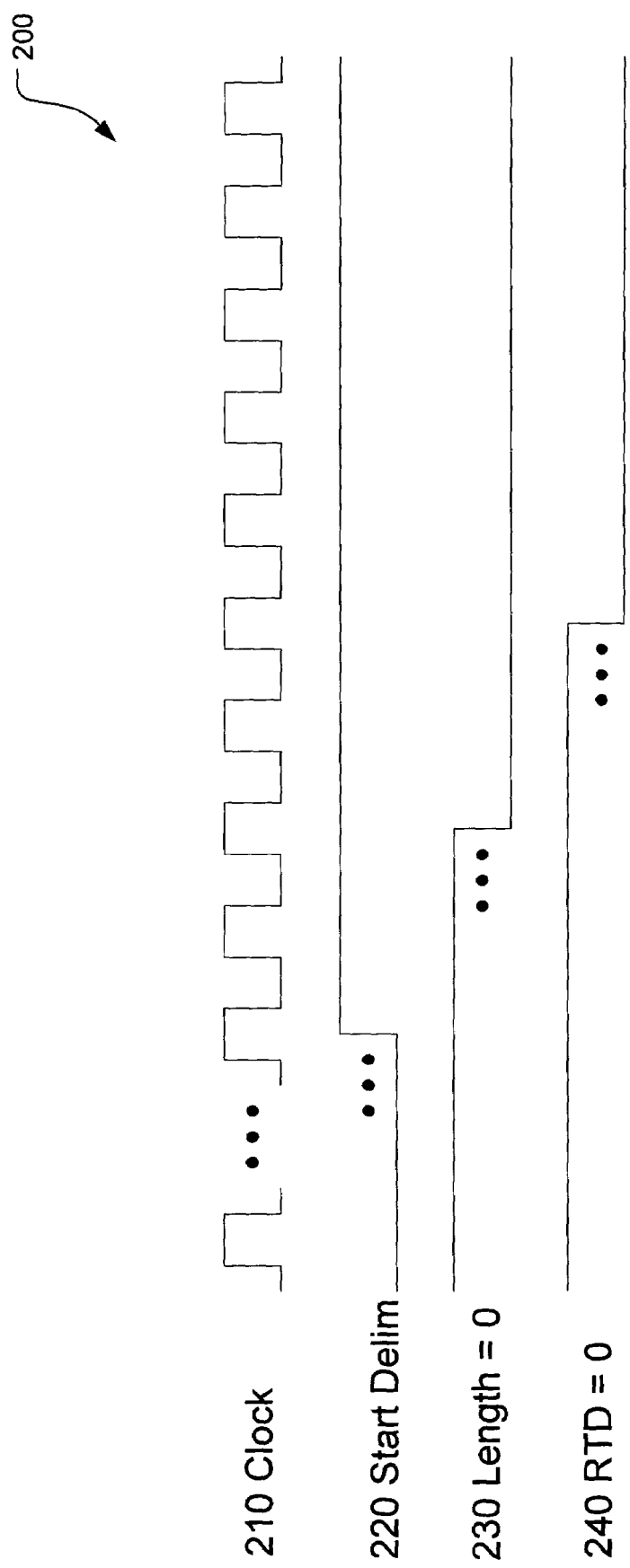
FIG. 2 illustrates a signal timing diagram of an embodiment to provide a self test method and apparatus for memory.

FIG. 2 illustrates a signal timing diagram 200 of an embodiment to provide a self test method and apparatus for memory. For example, embodiment 100 may be synchronized with clock signal 210. At the start of a test pattern generator 130 may begin and a data pattern may begin transmission. At this point the length counter 110 may begin counting down with each clock and the RTD counter 120 may begin counting up to determine the round trip delay of the transmitted pattern until the start delimiter is received.

Referring to FIG. 2, some time after the test is started, a start delimiter 220 may be received and thus start pattern generator 150 and stop RTD counter 120. Pattern generator 130 will generate the data pattern until length counter 110 designates that the pattern is complete and at this time RTD counter 120 can start counting down to designate the end of the code has been transmitted and after a round trip delay time the last code will be received and the test will be complete, as designated when RTD signal 240 equals zero.

An embodiment may be simplified if pattern generator 130 is removed. In this embodiment, test circuitry on a memory may be used to check data generated by some other means such as another chip, test equipment, etc. For example, an embodiment may use a single length counter and start counting when a start delimiter is detected and complete a test when the length counter expires. In similar fashion to the embodiments above, an end delimiter may be used instead of a start delimiter.

Figure 3:
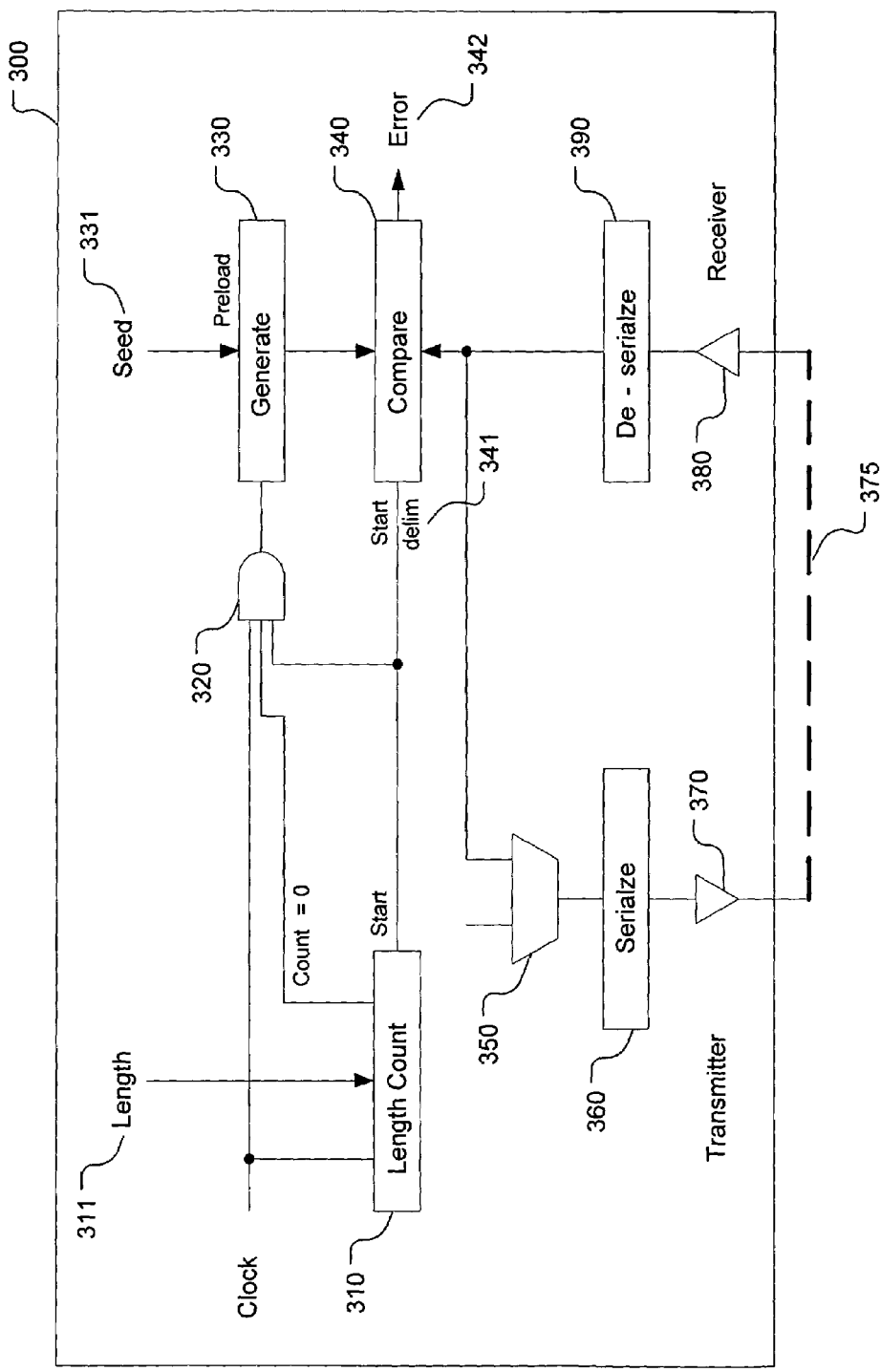
FIG. 3 illustrates an embodiment comprising a data checker to provide a self test method and apparatus for memory.

FIG. 3 illustrates an embodiment 300 comprising a data checker to provide a self test method and apparatus for memory. Embodiment 300 operates in similar fashion to the embodiment in FIG. 1, but does not require pattern generator 130 on the transmit side or a RTD counter because the data pattern may be generated off-chip.

FIG. 3 includes a multiplexer 350, a serializer 165 and a transmitter 170, but these are not required for receiving and testing a data pattern. That is, in some embodiments a test data pattern may be received on receiver 380 that does not traverse path 375.

Figure 4:
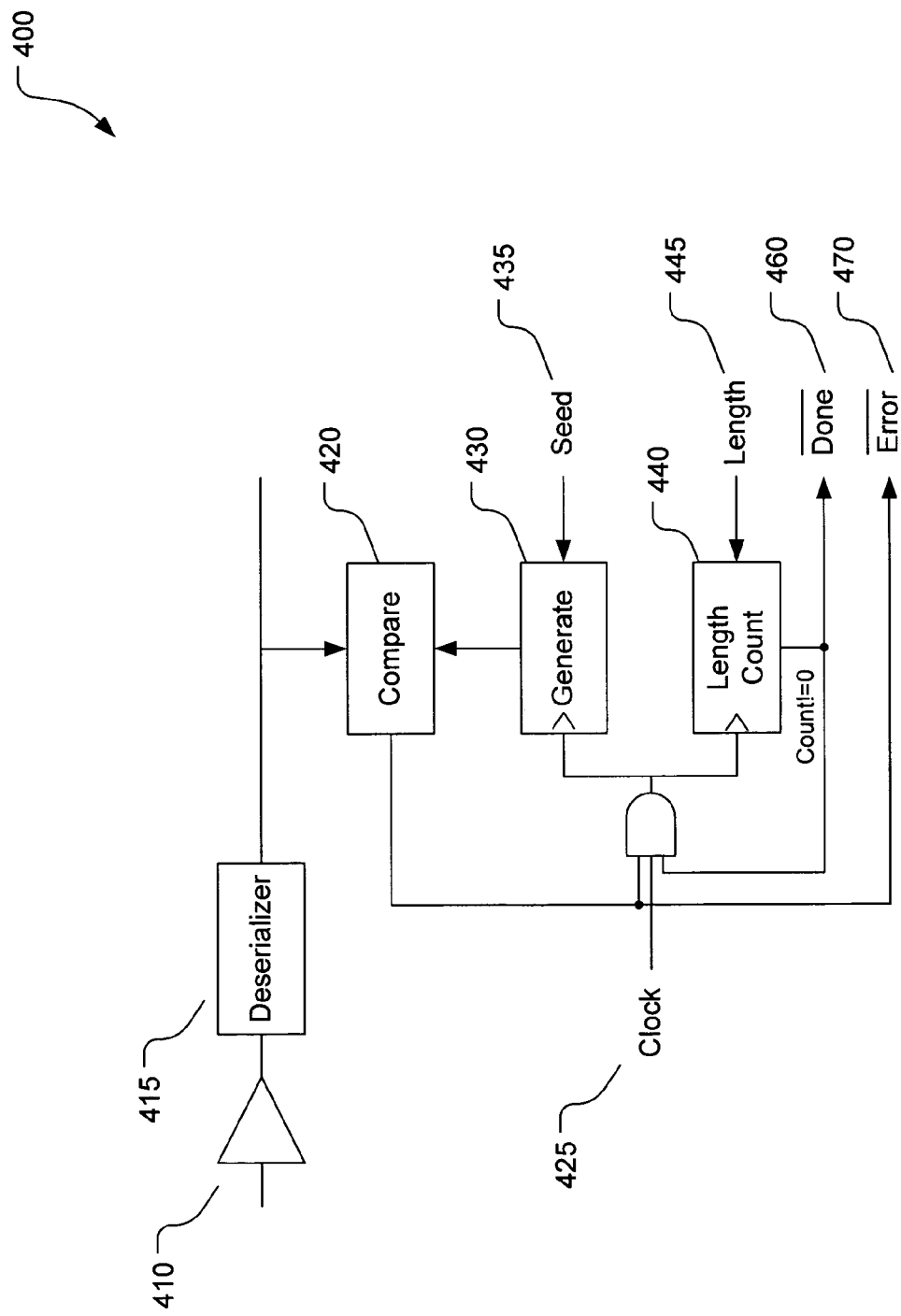
FIG. 4 illustrates another embodiment comprising a data checker to provide a self test method and apparatus for memory.

FIG. 4 illustrates another embodiment 400 comprising a data checker to provide a self test method and apparatus for memory. According to the present embodiment, a seed value 435 may be preloaded into a pattern generator 430 and a pattern may be generated and compared with a received test data pattern. In general, a memory may receive a test data pattern and compare it to an expected pattern and determine if an error occurred. In an embodiment the pattern generator 430 may include an LFSR.

In an embodiment, receiver 410 may receive a data pattern and then pass the data pattern to deserializer 415. Embodiments are not restricted to serial receivers or deserialized data patterns on chip as are shown in the embodiment in FIG. 4. The received data pattern may be sent to comparator 420 to be compared to the data pattern generated in pattern generator 430.

In the embodiment in FIG. 4, a length counter 440 may be used to determine when the comparator 420 has finished comparing the generated data pattern and the received test data pattern. The present embodiment may provide a done signal 460 when the length counter 440 has counted down. Additionally, the embodiment may provide an error signal 470 if an error is detected in the comparator 420 between the received test data pattern and the generated data pattern.

Referring to FIG. 4, an embodiment may use a start delimiter as disclosed above. For example, the length counter 440 and pattern generator 430 may be initialized with any appropriate values. At this point the comparator 420 may output a zero until a start delimiter is detected. Upon detection of the start delimiter, the pattern generator 430 and length counter 440 may be enabled and begin counting and continue counting so long as the pattern generator 430 output matches the input test data pattern when compared in comparator 420.

If an error is detected, counting can halt and error signal 470 is asserted. Furthermore, the length counter 440 may be read to determine the clock cycle that the error occurred in while the pattern generator will contain the expected data pattern and if the de-serialized data is latched and held, the data latch will contain the actual data. If length counter 440 expires, the done signal 460 will be asserted and counting can stop. In this case the error signal 470 will remain de-asserted to indicate there was no error that was detected.

An embodiment may comprise an apparatus 400 that includes a receiver 410 to receive a test data pattern from a link, a data generator 430 to generate a data pattern from a seed value, a comparator 420 coupled with the receiver 410 and the data generator 430, the comparator 420 to compare the data pattern with the test data pattern and to verify proper operation of a memory channel. In an embodiment the data generator 430 includes a linear feedback shift register. In another embodiment the link may be a serial differential link and the seed value may be received over the serial differential link. The present embodiment may further comprise a length counter to determine the end of the comparison between the data pattern and the test data pattern.

Figure 5:
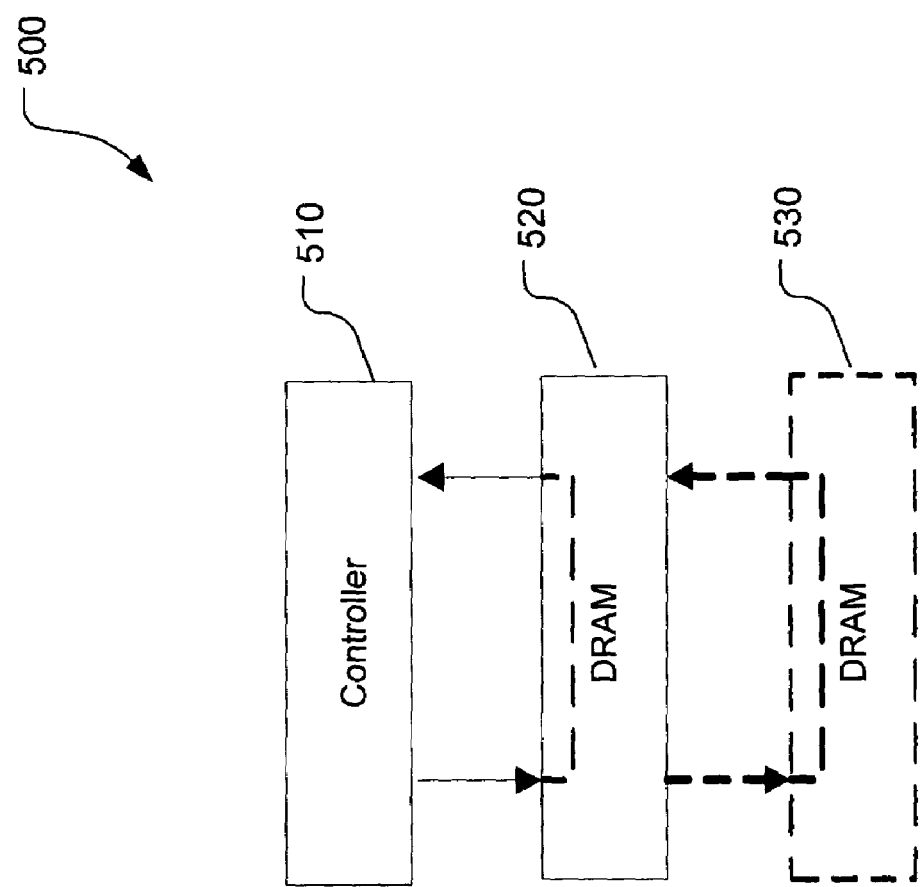
FIG. 5 illustrates an embodiment to self test method and apparatus for memory that may receive a test data pattern from another source.

FIG. 5 illustrates an embodiment to self test a memory that may receive a test data pattern from another source. An embodiment may use a data pattern that was generated off-chip, such as a data pattern from a controller 510, another memory 520, etc., and can receive the test pattern and compare it to a data pattern to determine if an error has occurred in memory IO. A controller may be a memory controller, a processor, another memory with a controller, or any device that may operate to control the memory, memory IO or memory channels, etc. The present embodiment illustrates the memory devices as DRAMs, but embodiments need not be limited to DRAMs.

Referring to FIG. 5, an embodiment may comprise a system 500 that includes a data generator 130 to generate a data pattern, a transmitter 170 in communication with the data generator, the transmitter 170 to transmit the data pattern over a link as a test data pattern. The present features (not shown in FIG. 5) may be incorporated in either DRAM 520 or controller 510, etc. FIG. 5 illustrates memories as DRAMs, but embodiments need not be so limited. The present embodiment may further comprise a memory 530 that has a receiver 410 to receive the test data pattern from the link, and a comparator 420 coupled with the receiver, the comparator 420 to compare the data pattern with the test data pattern and verify proper operation of a memory channel.

Some embodiments may further comprise using a start delimiter to delay comparing the data patterns to allow for delay in transmitting and receiving the data pattern. In an embodiment, the data generator 130 includes an LFSR to generate the data pattern from a seed value. In some embodiments, the memory 530 may further comprise a data generator 330 to generate the data pattern from the seed value and provide it to the comparator 340 to compare with the test data pattern. In yet another embodiment, the memory may further comprise a length counter 440 to determine the end of the comparison between the data pattern and the test data pattern.

In some embodiments, additional stress may be imparted on a link in the form of noise or jitter injection, reduction in signaling voltages, skew of data timings relative to reference clocks, or similar methods, to increase resolution of a self test of memory IO. These techniques may be combined with a loopback test to measure the operational limits of the link.

Figure 6:
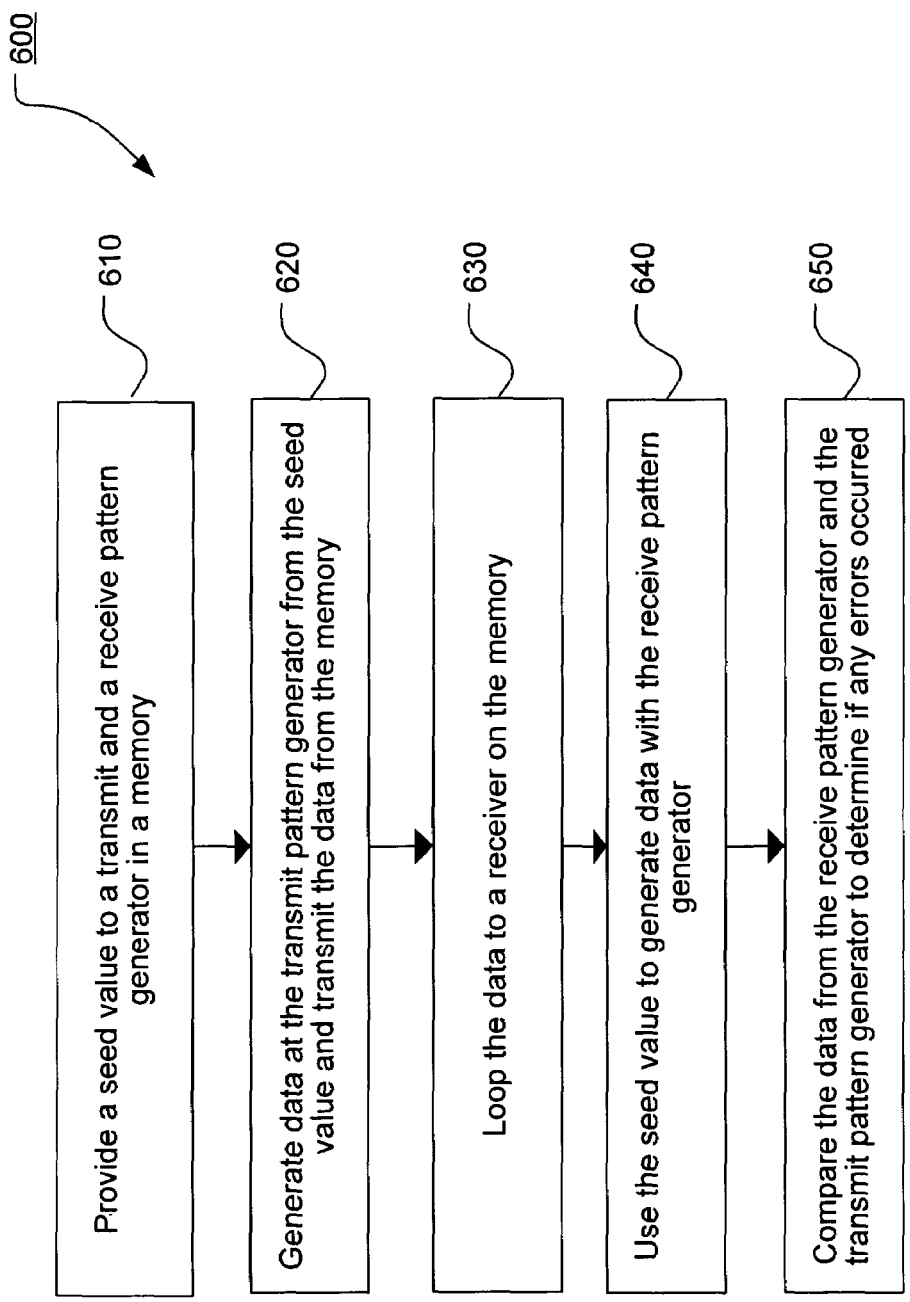
FIG. 6 illustrates an embodiment method to self test a memory.

FIG. 6 is a flow chart illustrating an embodiment method 600 to self test a memory. Referring to the illustration, an embodiment may comprise providing a seed value to a transmit and a receive pattern generator in a memory as shown in block 610, in block 620 the method may generate data at the transmit pattern generator from the seed value and transmitting the data from the memory, the method may include looping the data to a receiver on the memory as represented in block 630 and using the seed value to generate data with the receive pattern generator in block 640, and in block 650 the method may include comparing the data from the receive pattern generator and the transmit pattern generator to determine if any errors occurred.

Some embodiments may further comprise placing a start delimiter in the data from the transmit pattern generator and when the start delimiter is received, enabling the receive pattern generator to use the seed value to generate data. The present embodiment may further provide that the start delimiter is the first value in the data from the transmit pattern generator.

An embodiment may further comprise starting a round trip delay counter when the last value is sent from the transmit pattern generator and when the round trip delay counter expires the entire test pattern has been compared. The present embodiment may further comprise using a length counter to determine when the transmit pattern generator has generated a complete data pattern and then to start the round trip delay counter.

The present invention may be embodied in other specific forms without departing from its spirit or essential characteristics. The described embodiments are to be considered in all respects only as illustrative instead of restrictive or limiting. Therefore, the scope of the invention is indicated by the appended claims rather than by the foregoing description. All changes, modifications, and alterations that come within the meaning, spirit, and range of equivalency of the claims are to be embraced as being within the scope of the appended claims.

The invention claimed is:

1. An apparatus comprising:
   a first data generator to generate a test data pattern;
   a transmitter in communication with the first data generator, the transmitter to transmit the test data pattern;
   a multiplexer coupled between the first data generator and the transmitter to pass the data pattern to be received by the transmitter;
   a receiver to receive the test data pattern after it has been transmitted by the transmitter;
   a second data generator to generate a second data pattern;
   a comparator coupled with the receiver, the comparator to compare the second data pattern with the test data pattern from the receiver and to verify proper operation of a memory channel, wherein a start delimiter is used to delay the comparison to allow for delay in transmitting and receiving the test data pattern;
   a length counter to count a length of the test data pattern; and
   a round trip delay counter to time the delay between transmitting the test data pattern and receiving the test data pattern, wherein a number of clocks between a transmission and receipt of the start delimiter is counted by round trip delay counter;
   wherein the multiplexer selectively passes the received test data pattern to be re-transmitted by the transmitter.

2. The apparatus of claim 1 wherein the first data generator includes a linear feedback shift register to generate the test data pattern from a seed value.

3. The apparatus of claim 1, further comprising:
a serializer to serialize the test data pattern and provide the test data pattern in serialized form to the transmitter; and
a deserializer to deserialize the test data pattern received by the receiver and provide the deserialized test data pattern to the comparator and to the multiplexer, wherein the multiplexer selectively passes the received deserialized test data pattern to the serializer.

4. The apparatus of claim 1, further comprising a first memory to receive the test data pattern and to provide a return of the test data pattern to the receiver.

5. The apparatus of claim 4, further comprising a second memory to receive the test data pattern from the first memory, wherein the second memory is to provide a return of the test data pattern to the first memory, which then provides a return of the data test pattern from the second memory to the receiver.

6. The apparatus of claim 1, further comprising a first memory chip and a second memory chip, wherein the first memory chip is to receive the test data pattern from the transmitter and provide it to the second memory chip which is to provide the test data pattern back to the first memory chip which then provides it to the receiver.

* * * * *